United States Patent
Yin et al.

(10) Patent No.: US 8,994,119 B2
(45) Date of Patent: Mar. 31, 2015

(54) SEMICONDUCTOR DEVICE WITH GATE STACKS HAVING STRESS AND METHOD OF MANUFACTURING THE SAME

(75) Inventors: Huaxiang Yin, Beijing (CN); Zuozhen Fu, Beijing (CN); Qiuxia Xu, Beijing (CN); Chao Zhao, Kessel-lo (BE); Dapeng Chen, Beijing (CN)

(73) Assignee: The Institute of Microelectronics Chinese Academy of Sciences, Beijing (CN)

( * ) Notice: Subject to any disclaimer, the term of this patent is extended or adjusted under 35 U.S.C. 154(b) by 150 days.

(21) Appl. No.: 13/520,618

(22) PCT Filed: Apr. 11, 2012

(86) PCT No.: PCT/CN2012/000487
§ 371 (c)(1),
(2), (4) Date: Jul. 5, 2012

(87) PCT Pub. No.: WO2013/134899
PCT Pub. Date: Sep. 19, 2013

(65) Prior Publication Data
US 2013/0241004 A1    Sep. 19, 2013

(30) Foreign Application Priority Data
Mar. 14, 2012   (CN) .......................... 2012 1 0067446
Apr. 11, 2012   (WO) ................ PCT/CN2012/000487

(51) Int. Cl.
*H01L 27/088*    (2006.01)
*H01L 21/8236*   (2006.01)
(Continued)

(52) U.S. Cl.
CPC  *H01L 21/823807* (2013.01); *H01L 21/823842* (2013.01); *H01L 29/4966* (2013.01); *H01L 29/517* (2013.01); *H01L 29/518* (2013.01); *H01L 29/66545* (2013.01); *H01L 29/7845* (2013.01)
USPC ......................................... 257/392; 438/275

(58) Field of Classification Search
CPC ............... H01L 21/823828; H01L 21/823842; H01L 21/823437; H01L 21/82345; H01L 21/28061; H01L 21/28079; H01L 21/28088; H01L 29/66545; H01L 21/8238; H01L 21/823807; H01L 29/4966; H01L 29/517; H01L 29/518
USPC .......... 257/351, 369, 407, 402, 392; 438/157, 438/652–660, 275
See application file for complete search history.

(56) References Cited

U.S. PATENT DOCUMENTS
2004/0137703 A1 *  7/2004  Gao et al. ...................... 438/592
2007/0066001 A1 *  3/2007  Iinuma ......................... 438/199
(Continued)

FOREIGN PATENT DOCUMENTS
CN     1790715 A     6/2006
CN    102299154 A   12/2011

*Primary Examiner* — Khiem D Nguyen
*Assistant Examiner* — Pauline Vu
(74) *Attorney, Agent, or Firm* — Treasure IP Law Group

(57) ABSTRACT

The present invention discloses a semiconductor device, comprising substrates, a plurality of gate stack structures on the substrate, a plurality of gate spacer structures on both sides of each gate stack structure, a plurality of source and drain regions in the substrate on both sides of each gate spacer structure, the plurality of gate spacer structures comprising a plurality of first gate stack structures and a plurality of second gate stack structures, wherein each of the first gate stack structures comprises a first gate insulating layer, a first work function metal layer, a second work function metal diffusion blocking layer, and a gate filling layer; Each of the second gate stack structures comprises a second gate insulating layer, a first work function metal layer, a second work function metal layer, and a gate filling layer, characterized in that the first work function metal layer has a first stress, and the gate filling layer has a second stress. Two metal gate layers of different types and/or intensity of stress are formed, respectively, thus different stresses are applied to the channel regions of different MOSFETs effectively and accurately, the device carrier mobility is enhanced simply and efficiently, and the device performance is also enhanced.

19 Claims, 3 Drawing Sheets

(51) Int. Cl.
*H01L 21/8238* (2006.01)
*H01L 29/49* (2006.01)
*H01L 29/78* (2006.01)
*H01L 29/51* (2006.01)
*H01L 29/66* (2006.01)

(56) References Cited

U.S. PATENT DOCUMENTS

| | | | |
|---|---|---|---|
| 2007/0138559 A1* | 6/2007 | Bohr | 257/351 |
| 2008/0079084 A1* | 4/2008 | Hanafi | 257/369 |
| 2008/0203485 A1 | 8/2008 | Chudzik et al. | |
| 2009/0174003 A1* | 7/2009 | Chang et al. | 257/369 |
| 2009/0230479 A1* | 9/2009 | Hsu et al. | 257/369 |
| 2010/0001323 A1* | 1/2010 | Tateshita | 257/288 |
| 2010/0059833 A1* | 3/2010 | Yu et al. | 257/410 |
| 2010/0068877 A1* | 3/2010 | Yeh et al. | 438/592 |
| 2010/0127336 A1* | 5/2010 | Chambers et al. | 257/369 |
| 2010/0193872 A1* | 8/2010 | Carter et al. | 257/368 |
| 2010/0276760 A1* | 11/2010 | Tsuchiya | 257/369 |
| 2010/0301427 A1 | 12/2010 | Lenski et al. | |
| 2011/0215409 A1* | 9/2011 | Li et al. | 257/351 |
| 2012/0139061 A1* | 6/2012 | Ramachandran et al. | 257/410 |
| 2012/0326238 A1* | 12/2012 | Chien et al. | 257/369 |
| 2013/0015580 A1* | 1/2013 | Jain et al. | 257/751 |
| 2013/0026578 A1* | 1/2013 | Tsau | 257/368 |
| 2013/0040455 A1* | 2/2013 | Chan et al. | 438/653 |

* cited by examiner

SEMICONDUCTOR DEVICE WITH GATE STACKS HAVING STRESS AND METHOD OF MANUFACTURING THE SAME

CROSS REFERENCE

This application is a National Phase application of, and claims priority to, PCT Application No. PCT/CN2012/000487, filed on Apr. 11, 2012, entitled 'SEMICONDUCTOR DEVICE AND METHOD OF MANUFACTURING THE SAME', which claimed priority to Chinese Application No. CN 201210067446.7, filed on Mar. 14, 2012. Both the PCT Application and Chinese Application are incorporated herein by reference in their entireties.

FIELD OF THE INVENTION

The present invention relates to a semiconductor device and a method of manufacturing the same, more particularly, to a MOSFET for applying a stress to a channel region by a metal gate having stress to enhance the carrier mobility and a method of manufacturing the same.

BACKGROUND OF THE INVENTION

From the 90 nm CMOS integrated circuit technique, Strain Channel Engineering with the purpose of enhancing carrier mobility of channel plays an increasingly important role with continuous reduction of a feature size of a device. A plurality of uniaxial process induced stress technology are used in device manufacturing process, that is, compressive stress or tensile stress is introduced in the channel direction so as to enhance the carrier mobility of channel and to enhance performance of the device. For example, for 90 nm process node, compressive stress in a PMOS device is provided by using embedded SiGe (e-SiGe) source/drain or using a (100) crystal orientation substrate in combination with a tensile stress contact etch stop layer (tCESL); for 65 nm process node, the first generation source/drain stress memorization technique ($SMT^{\times 1}$) is further adopted on the basis of the 90 nm process node, for example, a dual contact etch stop layer is used; for 45 nm process node, the second generation source/drain stress memorization technique ($SMT^{\times 2}$) is used on the basis of the previous technique, for example, e-SiGe technique may be used in combination with a tCESL or a dual CESL, besides, Stress Proximity Technique (SPT) may be used, moreover, a (110)-plane substrate is adopted for PMOS and a (100)-plane substrate is adopted for NMOS; after 32 nm process node, the third generation source/drain stress memorization technique ($SMT^{\times 3}$) is used, for example, embedded SiC source/drain is used on the basis of the previous techniques to enhance the tensile stress in a NMOS device.

Moreover, technology of introducing stress to a channel can be realized by controlling a material or a cross-section shape of a channel or spacer apart from changing the materials of the substrate or source/drain. One example is that a dual stress liner (DSL) technique can be adopted. Another example is that a tensile stress $SiN_x$ layer spacer can be adopted for a NMOS and a compressive stress spacer can be adopted for a PMOS. Still another example is that the cross-section of the embedded SiGe source/drain is manufactured as a Σ-shaped so as to improve the channel stress in PMOS.

However, the effect of these conventional stress technologies is weakened increasingly with the continuous reduction in the size of devices. For a NMOS, dislocation and offset between the thin film layers providing stress become increasingly obvious with the reduction in the feature size, which requires providing higher stress precisely while the thickness of the thin films has to be thinned. For a PMOS, carrier mobility of channel in embedded SiGe source/drain technology significantly depends on the feature size, and thereby reduction in size compromises the effect of enhancing carrier mobility greatly.

A new idea is to provide a strain to the device channel by a metal gate stress (MGS), to thereby weaken the disadvantageous effect where conventional stress sources such as a source and drain heteroepitaxial layer and a stained inner liner insulating layer are continuously reduced with reduction in the device size, such that the stress layer can directly act on the channel, while independent of the size. For example, *Effects of Film Stress Modulation Using TiN Metal Gate on Stress Engineering and Its Impact on Device Characteristics in Metal Gate/High-k Dielectric SOI FinFETs*, published by ChangYongKang et al. on IEEE ELETRON DEVICE LETTERS, VOL. 29, NO. 5 on May, 2008, discloses that high-stressed TiN is used in the metal gate stack to apply a stress to the channel in the substrate directly, to thereby enhance the channel carrier mobility correspondingly and improve the device electrical performance. Besides, US patents NO. US2008/0203485A1 and US2004/0137703A1 also disclose similar structures.

On the other hand, starting from the 45 nm CMOS integrated circuit technology, with continuous reduction in the device feature size, the equivalent oxide thickness (EOT) of a gate insulating dielectric layer in a CMOS device must be reduced synchronously to suppress the short channel effect. However, the ultra-thin (e.g., 10 nm) conventional oxide layer or oxynitride layer may result in severe gate current leakage since the (relative) dielectric constant is not high (e.g., about 3.9) and the insulating capability can hardly endure the relatively high field strength in such an ultra-small device. Hence, a conventional polysilicon/SiON system is no longer applicable.

In view of this, high-K (HK) dielectric materials are started to be used to manufacture a gate insulating dielectric layer in the industry. However, the interfacial charges and polarization charges of high-K materials will cause difficulty in regulating the threshold of a device, and the combination of poly-silicon and high-K materials will produce a Fermi-level pinning effect, thus such combination of polysilicon and high-K materials can not be used for regulating the threshold of a MOSFET, accordingly, the gate electrode shall employ different metal materials to regulate the threshold of a device, that is, using a metal gate (MG)/HK structure.

Metal electrodes of different work functions are needed for regulating the threshold of different MOSFETs, e.g., a NMOS and a PMOS. The regulation method using a single metal gate material may be adopted, but the range of regulation is limited. In an example of a planar SOI multi-gate device with lower standby power employing a single metal gate material, to correspond to a work function of 4.1 eV of n+ polysilicon and a work function of 5.2 eV of p+ polysilicon, an appropriate metal electrode may be selected such that the work function of the gate can be in the vicinity of the median value of the two, e.g., to be 4.65 eV or 4.65±0.3 eV. However, the device threshold is hard to be effectively controlled by such a fine regulation within a small range. The optimal process is to adopt gate electrodes of different metal materials, for example, conduction-band metal is used for the NMOS and valence-band metal is used for the PMOS such that the gate work functions of the NMOS and the PMOS can be located at the edges of the conduction band and the valence band, respectively, e.g., 4.1±0.1 eV and 5.2±0.1 eV, respectively. A detailed study of selection of the materials for these gate metal (including metal nitride) has been made in the industry, and no more unnecessary details will be provided here.

FIG. 1 illustrates a CMOSFET having a typical MG/HK structure under the manufacturing process of 45/32 nm by Intel Corporation, the left part is a PMOS, and the right part is a NMOS. Although the two parts are displayed to be adjacent to each other in the figure, they may have many intermediate separation elements in an actual layout, thus shall be specifically set depending on the design requirements in the layout, and likewise below. Particularly, the CMOS comprises a substrate 1, shallow trench isolations (STIs) 2, source and drain regions 3, source and drain extension regions 4, gate spacers 5, metal silicide layers 6 on the source and drain regions, a contact etch stop layer (CESL) 7, an interlayer dielectric layer (ILD) 8, gate insulating layers 9, gate conductive layers 10, and source and drain contacts 11. Wherein the source and drain regions 3 are preferably embedded stressed source and drain regions, for example, (raised) SiGe for a PMOS, and Si:C for a NMOS. The gate insulating layers 9 preferably comprise a multi-layer stack structure, for example, low-K (LK) interface layers such as $SiO_2$ and high-K (HK) insulating dielectric layers such as Hf based oxide (for example, $HfO_2$ etc.), wherein the interface layers are used to optimize the interfaces between the gate insulating layers and the channels in the the substrate to reduce the defects.

The gate conductive layers 10 preferably comprise a multi-layer stack structure, for example, a gate material layer 10a made from TiN for regulating a work function, a gate blocking layer 10b made from TaN etc. for selectively controlling gate filling, and a gate filling layer 10c made from TiAl etc. Wherein the gate conductive layer 10 of the PMOS comprises the above 10a, 10b and 10c, while the gate conductive layer 10 of the NMOS only comprises 10a and 10c, and in the NMOS, Al is diffused into the TiN layer to thereby form an TiAl/TiN—Al laminated structure. The CMOS device adjusts the depth of Al atoms in the TiAl layer being diffused into the TiN layer by a thickness ratio between the layer 10a and layer 10c, to thereby regulate the work function. Al being diffused into the HK insulating dielectric layer or being away from the HK insulating dielectric layer (equivalent to pure TiN metal gate) will both result in the work function to be increased and to be adaptive to a PMOS, while only Al being located at an upper part close to the HK insulating dielectric layer/TiN interface can result in a lower work function and be adaptive to a NMOS.

Specifically, the method for forming the multi-layer stack structure of the gate conductive layer 10 may comprise performing etching to form a PMOS gate trench and a NMOS gate trench, sequentially depositing a PMOS work function metal layer 10a and a NMOS work function metal diffusion blocking layer 10b in the two trenches, then performing selective etching to remove the NMOS work function metal diffusion blocking layer 10b from the NMOS gate trench, and depositing a filling metal 10c in the two trenches, wherein the filling metal 10c may also function as a NMOS work function diffusion metal layer, then performing CMP to expose the ILD 8. In such a way, MOSFET with a single layer HK dual work function metal gate can be formed.

However, the multi-layer gate stack structure of the gate conductive layer 10 does not have a higher stress, thus the channel carrier mobility can not be effectively enhanced and the device performance can not be greatly improved.

SUMMARY OF THE INVENTION

As stated above, an object of the present invention is to provide a CMOSFET with new type metal gate capable of effectively increasing the channel stress and a method of manufacturing the same.

Therefore, the present invention provides a semiconductor device, comprising a substrate, a plurality of gate stack structures on the substrate, a plurality of gate spacer structures on both sides of each gate stack structure, a plurality of source and drain regions in the substrate on both sides of each gate spacer structure, the plurality of gate stack structures comprising a plurality of first gate stack structures and a plurality of second gate stack structures, wherein each of the first gate stack structures comprises a first gate insulating layer, a first work function metal layer, a second work function metal diffusion blocking layer, and a gate filling layer, each of the second gate stack structures comprises a second gate insulating layer, a first work function metal layer, a second work function metal layer, and a gate filling layer, characterized in that the second work function metal diffusion blocking layer has a first stress, the gate filling layer has a second stress, and the first stress is opposite to the second stress.

Wherein the first and/or the second gate insulating layer comprises at least one of silicon oxide, nitrogen-doped silicon oxide, silicon nitride, and high-K materials. Wherein the high-K materials include Hf-based materials selected from $HfO_2$, $HfSiO_x$, $HfSiON$, $HfAlO_x$, $HfTaO_x$, $HfLaO_x$, $HfAlSiO_x$, and $HfLaSiO_x$, rare-earth based high-K dielectric materials selected from $ZrO_2$, $La_2O_3$, $LaAlO_3$, $TiO_2$, and $Y_2O_3$, $Al_2O_3$, or a composite layer of the above materials.

Wherein the first work function metal layer comprises: a) metal nitride, including at least one of $M_xN_y$, $M_xSi_yN_z$, $M_xAl_yN_z$, and $M_aAl_xSi_yN_z$, wherein M is at least one of Ta, Ti, Hf, Zr, Mo, and W; and/or b) metal or metal alloy, including at least one of Co, Ni, Cu, Al, Pd, Pt, Ru, Re, Mo, Ta, Ti, Hf, Zr, W, Ir, Eu, Nd, Er, and La.

Wherein the second work function metal diffusion blocking layer comprises at least one of $M_xN_y$, $M_xSi_yN_z$, $M_xAl_yN_z$, and $M_aAl_xSi_yN_z$, wherein M is at least one of Ta, Ti, Hf, Zr, Mo, and W.

Wherein the gate filling layer comprises: a) metal nitride, including at least one of $M_xN_y$, $M_xSi_yN_z$, $M_xAl_yN_z$, and $M_aAl_xSi_yN_z$, wherein M is at least one of Ta, Ti, Hf, Zr, Mo, and W; and/or b) metal or metal alloy, including at least one of Co, Ni, Cu, Al, Pd, Pt, Ru, Re, Mo, Ta, Ti, Hf, Zr, W, Ir, Eu, Nd, Er, and La; and/or c) metal silicide, including at least one of $CoSi_2$, $TiSi_2$, NiSi, PtSi, NiPtSi, CoGeSi, TiGeSi, and NiGeSi; and/or d) metal oxide conductor, including at least one of $In_2O_3$, $SnO_2$, ITO, and IZO; and/or e) semiconductor materials, including at least one of doped polysilicon, amorphous silicon, polycrystalline germanium, and polycrystalline silicon-germanium; or a composite layer of the above materials.

Wherein the first stress is a tensile stress and the second stress is a compressive stress, or the first stress is a compressive stress and the second stress is a tensile stress.

Wherein the absolute value of the first stress and/or the second stress is greater than 1 GPa.

The present invention also provides a method for manufacturing a semiconductor device, comprising the steps of: forming a plurality of source and drain regions in a substrate; forming a plurality of gate spacer structures on the substrate, wherein the gate spacer structures enclose a plurality of first gate trenches and a plurality of second gate trenches, and there is an interlayer dielectric layer around the gate spacer structures; sequentially depositing a first gate insulating layer and a second gate insulating layer, a first work function metal layer, and a second work function metal diffusion blocking layer having a first stress in the first and second gate trenches; performing selective etching to remove the second work function metal diffusion blocking layer from the second gate trenches to expose the first work function metal layer; depositing a gate filling layer having a second stress on the second work function metal diffusion blocking layer in the first gate trenches and on the first work function metal layer in the second gate trenches, wherein the first stress is opposite to the second stress.

Wherein the first and/or the second gate insulating layer comprises at least one of silicon oxide, nitrogen-doped silicon oxide, silicon nitride, and high-K materials.

Wherein the high-K materials include Hf-based materials selected from $HfO_2$, $HfSiO_x$, HfSiON, $HfAlO_x$, $HfTaO_x$, $HfLaO_x$, $HfAlSiO_x$, and $HfLaSiO_x$, rare-earth based high-K dielectric materials selected from $ZrO_2$, $La_2O_3$, $LaAlO_3$, $TiO_2$, and $Y_2O_3$, $Al_2O_3$, or a composite layer of the above materials.

Wherein the first work function metal layer comprises: a) metal nitride, including at least one of $M_xN_y$, $M_xSi_yN_z$, $M_xAl_yN_z$, and $M_aAl_xSi_yN_z$, wherein M is at least one of Ta, Ti, Hf, Zr, Mo, and W; and/or b) metal or metal alloy, including at least one of Co, Ni, Cu, Al, Pd, Pt, Ru, Re, Mo, Ta, Ti, Hf, Zr, W, Ir, Eu, Nd, Er, and La.

Wherein the second work function metal diffusion blocking layer comprises at least one of $M_xN_y$, $M_xSi_yN_z$, $M_xAl_yN_z$, and $M_aAl_xSi_yN_z$, wherein M is at least one of Ta, Ti, Hf, Zr, Mo, and W.

Wherein the gate filling layer comprises: a) metal nitride, including at least one of $M_xN_y$, $M_xSi_yN_z$, $M_xAl_yN_z$, and $M_aAl_xSi_yN_z$, wherein M is at least one of Ta, Ti, Hf, Zr, Mo, and W; and/or b) metal or metal alloy, including at least one of Co, Ni, Cu, Al, Pd, Pt, Ru, Re, Mo, Ta, Ti, Hf, Zr, W, Ir, Eu, Nd, Er, and La; and/or c) metal silicide, including at least one of $CoSi_2$, $TiSi_2$, NiSi, PtSi, NiPtSi, CoGeSi, TiGeSi, and NiGeSi; and/or d) metal oxide conductor, including at least one of $In_2O_3$, $SnO_2$, ITO, and IZO; and/or e) semiconductor materials, including at least one of doped polysilicon, amorphous silicon, polycrystalline germanium, and polycrystalline silicon-germanium; or a multi-layer composite layer of the above materials.

Wherein the first stress is a tensile stress and the second stress is a compressive stress, or the first stress is a compressive stress and the second stress is a tensile stress.

Wherein the absolute value of the first stress and/or the second stress is greater than 1 GPa.

Wherein the deposition methods and process parameters are adjusted to achieve a different first stress and a different second stress.

Wherein, after formation of the gate filling layer, a surface high-temperature fast annealing is used to improve or change the stress.

Wherein, after deposition of the gate filling layer, an annealing or a subsequent deposition process is performed to form a second work function metal layer, wherein the temperature is not higher than 550° C., and the annealing time is not longer than 30 minutes.

In accordance with the semiconductor device and the method of manufacturing the same in the present invention, two metal gate layers of different types and/or intensity of stress are formed, respectively, thus different stresses are applied to the channel regions of different MOSFETs effectively and accurately, the device carrier mobility is enhanced simply and efficiently, and the device performance is also enhanced.

BRIEF DESCRIPTION OF THE DRAWINGS

The technical solutions of the present invention will be described in detail below with reference to the accompanying drawings, wherein.

DETAILED DESCRIPTION OF THE EMBODIMENTS

The features of the technical solutions of the present invention and the technical effects thereof are explained in detail in combination with the illustrative embodiments with reference to the drawings below, and a new type of MOSFET capable of effectively increasing the stress in the channel region and a method of manufacturing the same are disclosed. It shall be noted that like reference signs indicate like structures, and the terms like "first", "second", "on" and "below" etc. used in the present application may be used to modify various device structures or manufacturing processes. Unless specific explanations, such modifications do not imply the spatial, sequential or hierarchical relationships of the device structures or manufacturing processes.

The steps of the method for manufacturing a MOSFET in accordance with the present invention will be described in detail with reference to the diagrammatic cross-sections in FIGS. 2-8, wherein, particularly the method is preferably adaptable to the gate-last process.

Figure 2:
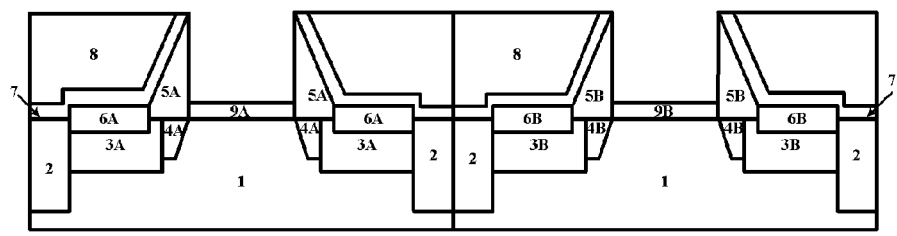
FIGS. 2-8 are diagrammatic cross-sections of the steps of the method for manufacturing a MOSFET in accordance with the present invention.

First, referring to FIG. 2, a CMOS basic structure is formed, that is, at least a first MOSFET and at least a second MOSFET are formed in the substrate comprising STIs, respectively. Wherein the first MOSFET comprises first source and drain regions, first source and drain extension regions, a first gate insulating layer, first gate spacers, first metal silicides, a first contact etch stop layer, and a first interlayer dielectric layer, and the second MOSFET comprises second source and drain regions, second source and drain extension regions, a second gate insulating layer, second gate spacers, second metal silicides, a second contact etch stop layer, and a second interlayer dielectric layer. The first MOSFET is of an opposite to the second MOSFET, for example, if the first MOSFET is a PMOS, the second MOSFET is a NMOS, if the first MOSFET is a NMOS, the second MOSFET is a PMOS. Likewise, the definitions of the materials, structures or characteristics involving "first" and "second" can all be mutually exchanged.

Figure 1:
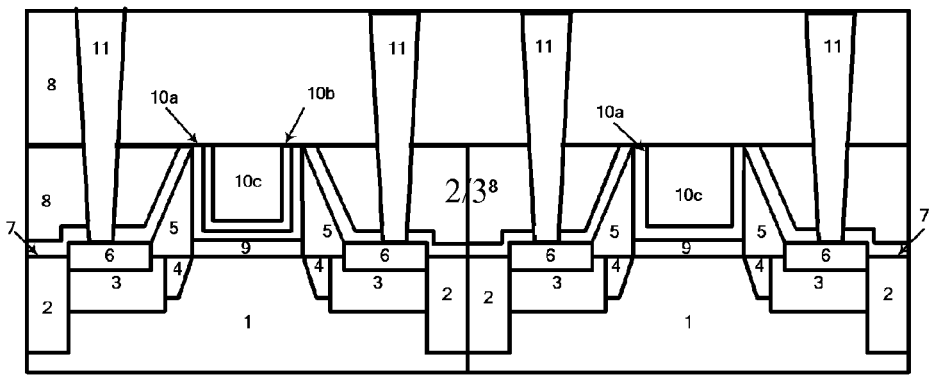
FIG. 1 is a diagrammatic cross-section of a gate-last MOSFET in the prior art.

Specifically, a substrate 1 is provided first. The substrate 1 shall be reasonably selected depending on the usage of the device and may comprise single crystalline bulk silicon (Si), silicon on insulator (SOI), single crystalline bulk germanium (Ge), germanium on insulator (GeOI), stained Si, SiGe, or compound semiconductor materials such as GaN, GaAs, InP, InSb, and C-based semiconductors such as graphene, SiC and carbon nanotube. As shown in FIG. 1, the substrate are of a block shape with the first MOSFET and the second MOSFET adjacently formed therein, but the two devices may also be separately formed, e.g., formed at well regions (not shown) of different conductivity types or formed with other separation electronic elements or structures located between them.

Second, shallow trench isolations (STIs) 2 are formed in the substrate 1. For example, photolithography/etching is performed firstly to form shallow trenches in the substrate 1, then an insulating isolation material is deposited by a conventional technique such as LPCVD and PECVD and planarized by chemical mechanical polishing (CMP) to expose the substrate 1, thereby forming STIs 2. Wherein the filling material for STIs 2 may be oxide, nitride, or oxynitride. As shown in the FIG. 2, STIs 2 divide the enclosed substrate 1 into at least a first MOSFET active region and at least a second MOSFET active region, selective deposition and etching will be performed to the two regions in the following process to thereby form devices of different types.

Third, a pad oxide layer and a pseudo gate layer are sequentially deposited on the surface of the entire wafer (i.e., the surface of the substrate 1 and STIs 2) and etched to form first and second pseudo gate stack structures (not shown). The first and second pseudo gate stack structures will be removed in the following process, so the pad oxide layer is preferably silicon oxide, and the pseudo gate layer is preferably polysilicon, amorphous silicon or microcrystalline silicon, even silicon oxide. The width and thickness of the first and second pseudo gate stack structures are set depending on the layout design rules for the PMOS and NMOS and the requirements of the device conductivity characteristics.

Then, first and second pseudo spacers (not shown) are formed on both sides of the first and second pseudo gate stack structures, respectively. For example, a spacer material layer formed of silicon oxide, silicon nitride, or a composite layer thereof is deposited on the device surface and then etched to form the pseudo gate spacers.

Next, first source and drain regions 3A and second source and drain regions 3B are formed in the substrate 1 on both sides of the pseudo gate spacers, respectively. Source and drain regions 3A/3B in traditional processes may be formed by respectively performing a first source and drain ion implantation to the substrate 1 using different masks so as to selectively implant doped ions of different conductivity types, e.g., to implant p-type impurities to the first MOSFET active region and to implant n-type impurities to the second MOSFET active region. In a preferred embodiment of the present invention, source and drain regions 3A/3B may be embedded strained source and drain regions, that is, the first MOSFET active region and second MOSFET region in the substrate 1 are etched by taking the first and second pseudo gate spacers as masks respectively to form first and second source and drain grooves (not shown), then high stress materials such as SiGe or Si:C which are different from the material of the substrate 1 are selectively epitaxially grown in the first and second source and drain grooves, to thereby form embedded stained source and drain regions of the corresponding material. Wherein the upper surface of the embedded strained source and drain regions 3A/3B is not limited to be flush with that of the substrate 1 as shown in FIG. 2, but may be higher than the upper surface of the substrate 1 to form raised sources and drains. Preferably, doped ions may also be implanted to the embedded strained source and drain regions 3A/3B to regulate the type and concentration, or in-situ doping may be performed while the above embedded sources and drains are formed. If the first MOSFET corresponds to the PMOS, the source and drain regions 3A are embedded strained SiGe (e-SiGe) with boron, aluminum, gallium and indium etc. doped, and if the second MOSFET corresponds to the NMOS, then the source and drain regions 3B are embedded strained Si:C (e-SiC) with phosphorus, arsenic, and antimony etc. doped, and vice versa.

Afterwards, the first or second pseudo gate spacers are respectively removed and first source and drain extension regions 4A or second source and drain extension regions 4B are formed in the substrate 1 on both sides of the first or second pseudo gate stack structure, respectively. Pseudo gate spacers formed of silicon nitride or silicon oxynitride may be removed by wet etching, then a second source and drain ion implantation is performed to form lightly doped (LDD) source and drain extension regions 4A/4B. Wherein the conductivity types of the source and drain extension regions 4A/4B are respectively the same as those of the source and drain regions 3A/3B, but the source and drain extensions regions 4A/4B have a lower doping concentration and a shallower junction depth.

Then, first gate spacer structures 5A and second gate spacer structures 5B are formed on both sides of the first and second pseudo gate stack structures, respectively. The gate spacer structures 5A/5B may be made from conventional materials with low stress or without stress, such as at least one of silicon oxide ($SiO_x$), silicon nitride ($SiN_x$, x may be 1~2, and is not limited to an integer), and silicon oxynitride ($SiO_xN_y$, x and y may be reasonably adjusted depending on requirements). Or, preferably, the first and/or the second gate spacer structures 5A/5B may be at least two-layer laminated structure, e.g., low stress gate spacer materials such as silicon oxide (SiOx), silicon nitride (SiNx, x may be 1~2, and is not limited to an integer), silicon oxynitride ($SiO_xN_y$, x and y may be reasonably adjusted depending on requirements), or a stack comprised of these materials may be deposited on the device surface by a conventional process, then the mask layout and the etching process parameters are controlled to make the low stress gate spacers obtained by etching have an L-shaped cross-section, namely comprising a vertical part which directly contacts the pseudo gate stack structure, and a horizontal part which directly contacts the embedded strained source and drain regions 3A/3B and/or source and drain extension regions 4A/4B. The first gate spacers 5A are used a buffer layer for high stress spacers with a preferred thickness of about 1~25 nm (a thinner thickness will be helpful to pass a stress). After low stress gate spacers are formed, the high stress gate spacers are then formed. A diamond-like amorphous carbon (DLC) thin film with higher intrinsic stress is formed by a low temperature process such as filtered cathodic vacuum arc (FCVA), PECVD, and magnetron sputtering, then $O_2$ and/or Ar plasma dry etching is used to form the high stress gate spacers on the horizontal part of the low stress gate spacers and enable the cross-section to be approximately a triangle or a ¼ ellipse. Wherein since the material characteristics of the DLC thin film greatly depend on the content of $sp^3$ bonds, a higher content of $sp^3$ bonds could make the DLC structure more like diamond than graphite. Therefore, in order to increase the intrinsic stress, the process parameters are controlled to make the content of sp3 bonds in DLC be at least greater than 50%, the content of hydrogen atoms be less than 40%, and the content of nitrogen atoms be less than 20%, such that the DLC thin film, which is used as the high stress gate spacer, may have an intrinsic stress not less than 2 GPa, preferably 4~10 GPa in a preferred embodiment of the present invention. The high stress gate spacers may have a preferred thickness of about 2~60 nm, and such high stress gate spacers can provide a much higher stress to the channel region, to thereby increase the carrier mobility and improve the device performance. As for a NMOS, the DLC thin film has tensile stress, while for a pMOS, the DLC thin film has compressive stress, thus the high stress gate spacer in the process for manufacturing a CMOS device shall be formed at two times so as to control the type and intensity of the stress, respectively.

Thereafter, a self-aligned silicide process is performed by respectively taking the first and second gate spacers 5A/5B as masks, and a thin film of metal such as Pt, Co, Ni and Ti or metal alloy is deposited on the entire device surface, then a high temperature annealing process is performed such that the silicon contained in the embedded strained source and drain regions 3A/3B reacts with the metal to produce first/second source and drain contact metal silicides 6A/6B such as $CoSi_2$, $TiSi_2$, NiSi, PtSi, NiPtSi, CoGeSi, TiGeSi, and NiGeSi so as to decrease the source and drain contact resistance, thereby to further improve the device performance.

Upon formation of the source and drain contact metal silicides 6A/6B, deposition is performed on the entire device surface to form a contact etch stop layer (CESL) 7, that is, CESL 7 is on the STIs 2, source and drain contact metal silicides 6A/6B, gate spacers 5A/5B, and pseudo gate structures, the materials thereof may be a traditional high stress material of $SiO_x$ or $SiN_x$, or the aforesaid high stress DLC. CESL 7 further improves the stress intensity, thus further increase the stress in the channel region. Specifically, the so-called high stress of CESL 7 in the present invention is that the intrinsic stress of the material is greater than 1 GPa, preferably between 2~10 GPa.

An interlayer dielectric layer (ILD) 8 is deposited for the gate-last process, the layer may be made from silicon oxide, phosphorosilicate glass, F-doped silicon oxide, C-doped silicon oxide, silicon nitride, low-K dielectric materials, or a multi-layer composite layer thereof; a process such as CMP and dry etching is used to planarize the ILD 8 such that its upper surface is flush with the top of the pseudo gate stack structure.

The first and second pseudo gate stack structures are removed by wet etching, to leave first and second gate trenches, as shown in FIG. 2. Then, silicon oxide, nitrogen-doped silicon oxide, silicon nitride, or other high-K materials are respectively deposited in the first and second gate trenches by a process such as PECVD, HDPCVD, and ALD, to form a first gate insulating layer 9A and a second gate insulating layer 9B. The gate insulating layer 9A/9B may only be located at the bottom of the first and second gate trenches, respectively, or be located at the bottom and sidewall of the gate trenches. The high-K materials used by the gate insulating layer 9A/9B include but not limited to Hf-based materials selected from $HfO_2$, $HfSiO_x$, HfSiON, $HfAlO_x$, $HfTaO_x$, $HfLaO_x$, $HfAlSiO_x$, and $HfLaSiO_x$, rare-earth based high-K dielectric materials selected from $ZrO_2$, $La_2O_3$, $LaAlO_3$, $TiO_2$, and $Y_2O_3$, $Al_2O_3$, or a composite layer of the above materials. Preferably, there is an interface layer (not shown in layers) made from low-K materials between the gate insulating layer 9A/9B made from high-K materials and the substrate 1 to reduce the interface defects, the material of the layer may be, e.g., at least one of silicon oxide, nitrogen-doped silicon oxide, and silicon nitride.

So far, the basic structure as shown in FIG. 2 has already been formed, and the technological process of forming the dual stress metal gate of the present invention will be further described in detail below by referring to FIGS. 3-8.

Figure 3:
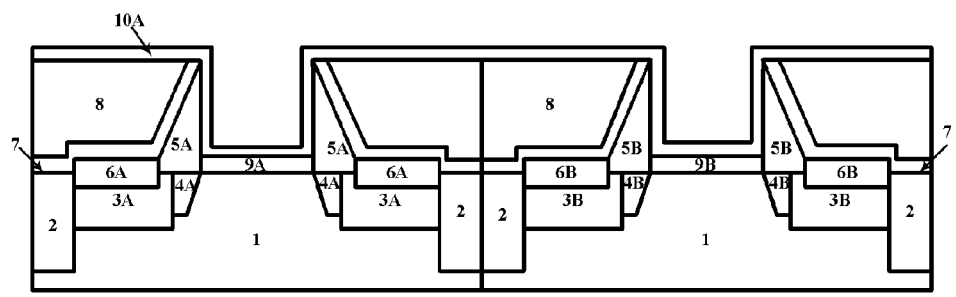

Next, referring to FIG. 3, a first work function metal layer 10A is deposited on the first and second gate insulating layers 9A/9B in the first and second gate trenches by a conventional process such as PVD, CVD and ALD, so as to regulate the work function of the first MOSFET metal gate. The first work function metal layer 10A may comprise: a) metal nitride made from $M_xN_y$, $M_xSi_yN_z$, $M_xAl_yN_z$, and $M_aAl_xSi_yN_z$, wherein M is Ta, Ti, Hf, Zr, Mo, W or other elements; and/or b) metal or metal alloy, including metal such as Co, Ni, Cu, Al, Pd, Pt, Ru, Re, Mo, Ta, Ti, Hf, Zr, W, Ir, Eu, Nd, Er, and La, or a combination of the above materials, and wherein elements such as C, F, N, O, B, P, As may be doped to regulate the conductivity type.

Figure 4:
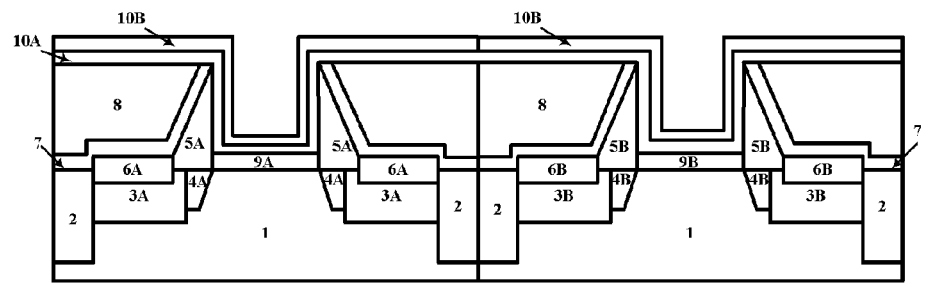

Subsequently, referring to FIG. 4, a second work function metal diffusion blocking layer 10B having a first stress is deposited on the first work function metal layer 10A by a conventional process such as PVD, CVD and ALD, the material thereof may be $M_xN_y$, $M_xSi_yN_z$, $M_xAl_yN_z$, and $M_aAl_xSi_yN_z$, wherein M is Ta, Ti, Hf, Zr, Mo, W, or other elements.

In accordance with the type of MOSFET corresponding to the first gate trenches, the deposition processes and parameters may be adjusted to regulate metal orientation, component ratio of materials, crystalline state, crystalline phase, O/N content etc., so as to adjust the type and intensity of the stress of layer 10B. For example, if the first MOSFET is a NMOS, the layer 10B provides a compressive stress. The absolute value of the intrinsic stress of the material is greater than 1 GPa, and preferably between 2~10 GPa. Preferably, the first work function metal layer 10A and the second work function metal diffusion blocking layer 10B may adopt not only a stacked composite layer structure but also adopt a mixed structure, that is, the materials for forming the first work function metal layer 10A and the material for forming the second work function metal diffusion blocking layer 10B are simultaneously deposited on the gate insulating layers 9A/9B, thus the gate material layer comprises the materials of the above blocking layer. The second work function metal diffusion blocking layer 10B having a stress will pass through the first work function metal layer 10A and the first gate insulating layer 9A below it to apply a stress to the channel region of the first MOSFET, to enhance the carrier mobility in the channel region of the first MOSFET, thereby improving the performance of the first MOSFET.

Figure 5:
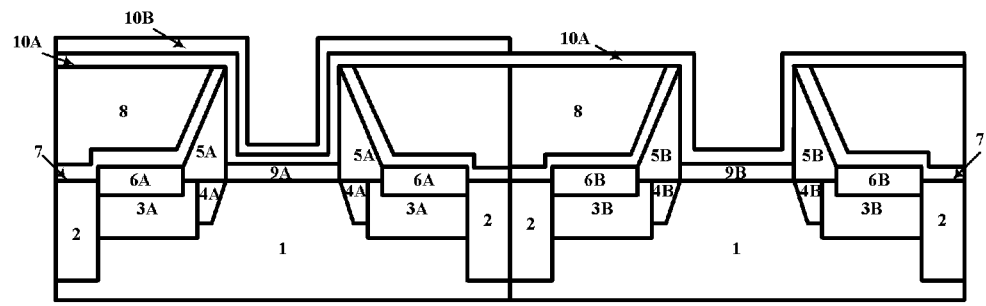

Then, referring to FIG. 5, a part of the second work function metal diffusion blocking layer 10B on the second MOSFET is selectively etched to expose the first work function metal layer 10A in the second gate trenches. For example, a hard mask or photoresist (not shown) is used to cover the first MOSFET, and then wet etching or dry etching is used to remove a part of the second work function metal diffusion blocking layer 10B.

Figure 6:
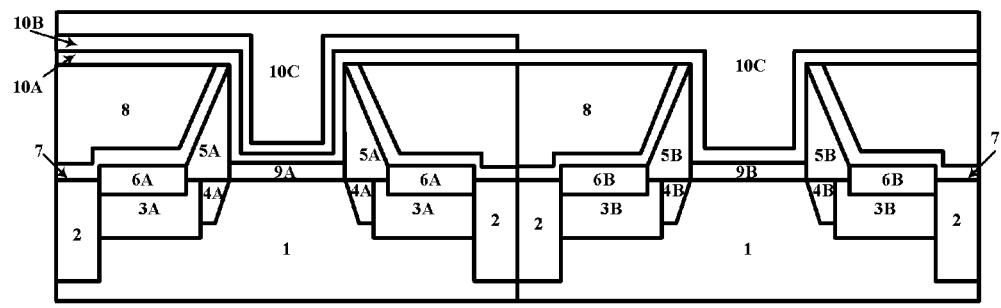

Next, referring to FIG. 6, a gate filling layer 10C having a second stress is deposited on the first and second MOSFETs by a conventional process such as PVD, CVD and ALD. The gate filling layer 10C may simultaneously function as the second work function diffusion metal layer, the material thereof may include: a) metal nitride, such as $M_xN_y$, $M_xSi_yN_z$, $M_xAl_yN_z$, and $M_aAl_xSi_yN_z$, wherein M is Ta, Ti, Hf, Zr, Mo, W or other elements; b) metal or metal alloy, such as Co, Ni, Cu, Al, Pd, Pt, Ru, Re, Mo, Ta, Ti, Hf, Zr, W, Ir, Eu, Nd, Er, and La; c) metal silicide, such as $CoSi_2$, $TiSi_2$, NiSi, PtSi, NiPtSi, CoGeSi, TiGeSi, and NiGeSi; d) metal oxide conductor, such as $In_2O_3$, $SnO_2$, ITO, and IZO; e) semiconductor materials, such as doped polysilicon, amorphous silicon, polycrystalline germanium, and polycrystalline silicon-germanium. Preferably, elements such as C, F, N, O, B, P, and As may be doped to regulate the work function. Furthermore, high-temperature fast annealing, e.g., including laser annealing and spike annealing, is preferably performed on the entire device surface (particularly the top surface of the gate filling layer 10C) to improve or change the stress. The gate filling layer 10C may, in accordance with the method for forming the second work function metal diffusion blocking layer 10B, for example, regulate the process parameters to make the layer 10C have a second stress which is of a different type of stress from the first stress of the layer 10B, e.g., if the layer 10B has a tensile stress, the layer 10C has a compressive stress, and vice versa. The absolute value of the stress of layer 10C is preferably greater than 1 GPa, and between 2 GPa~10 GPa. The stress of the layer 10C also passes through the first work function metal layer 10A and the first gate insulating layer 9B to enter into the channel of the second MOSFET, to thereby enhance the carrier mobility of the second MOSFET and improve the device performance.

Figure 7:
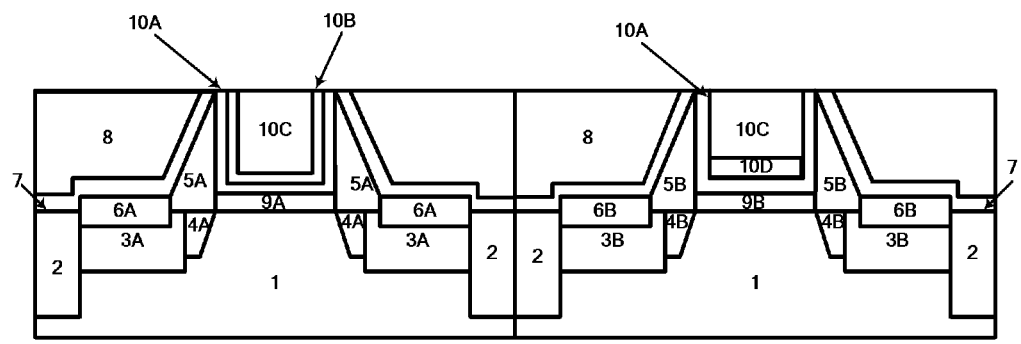

Subsequently, referring to FIG. 7, the first MOSFET and the second MOSFET are planarized by a process such as CMP to expose interlayer dielectric layers 8. Here, the annealing or subsequent process may be adopted to diffuse the elements in the gate filling layer 10C into an upper part of the interface between the first work function metal layer 10A and the second gate insulating layer 9B, to form a second work function metal layer 10D. Wherein the annealing temperature is not higher than 550° C., and the annealing time is not longer than 30 minutes, and RTA annealing, furnace annealing or laser annealing is used. Wherein the subsequent process comprises deposition of multi-layer gate filling layers, and the deposition of a next layer may cause the ions in the first layer to be diffused into the layer 10A, thereby forming the layer 10D. The second work function metal layer 10D may be located on the layer 10A to thereby form a four-layer structure 10C/10D/10A/9B, or below the layer 10A to form a four-layer structure 10C/10A/10D/9B, and may also be at the same position with the layer 10A to thereby form a three-layer structure 10C/10A (10D)/9B. Thus, the layer is not limited to the specific position as shown in FIG. 7, it may be determined depending on the requirement of regulating the metal gate work function of the second MOSFET. Preferably, the distance between the layer 10D and the interface of the layer 10A/layer 9B is less than or equal to 20 nm, more preferably less than or equal to 10 nm. For example, when the gate filling layer 10C comprises TiAl, Al is diffused to the interface between the layer 10A made of TiN and the high-K second gate insulating layer 9B, such that the metal gate work function of the second MOSFET is less than 4.55 eV, to thereby correspond to a NMOS, or greater than 4.55 eV, to thereby correspond to a PMOS.

Figure 8:
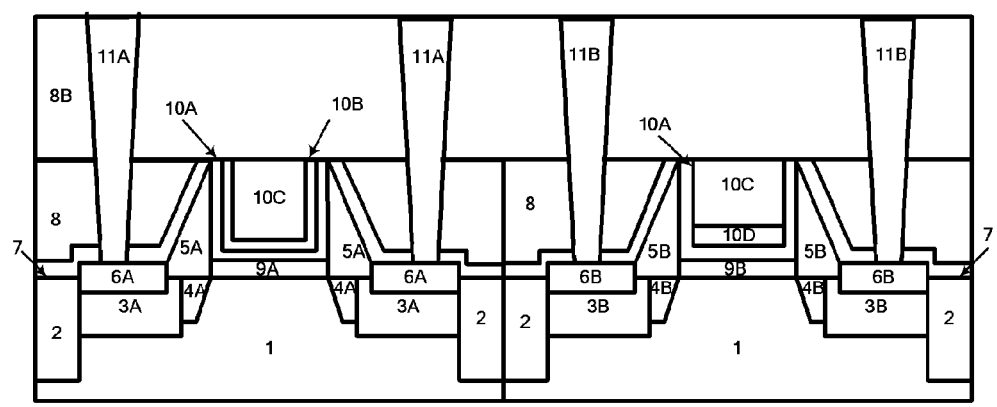

Finally, referring to FIG. 8, device manufacturing is completed. A second interlayer dielectric layer 8B is deposited on the surface of the entire device and is planarized by CMP. The first ILD 8, the second ILD 8B, and the CESL 7 are etched to form source and drain contact holes so as to expose first and second source and drain contact metal silicides 6A/6B. A contact metal is deposited to form first and second source and drain metal plugs 11A/11B and planarization is performed by CMP to expose the ILD 8B.

The structure of the finally formed semiconductor device is as shown in FIG. 8, comprising a substrate 1, STIs 2, at least a first MOSFET and at least a second MOSFET, wherein the first MOSFET comprises first source and drain regions 3A in the substrate 1, first source and drain extension regions 4A at the inner side of the first source and drain regions 3A, first gate spacers 5A on the first source and drain extension regions 4A, first source and drain contact metal silicides 6A on the first source and drain regions 3A, a first gate stack structure between the first gate spacers 5A on the substrate 1, a contact etch stop layer 7, interlayer dielectric layers 8/8B, and first source and drain metal plugs 11A passing though the interlayer dielectric layers to be in contact with the source and drain contact metal silicides 6A, the contact etch stop layer 7 being located on the first source and drain contact metal silicides 6A, first gate spacers 5A, and the first gate stack structure, wherein the first gate stack structure sequentially comprises a first gate insulating layer 9A, a first work function metal layer 10A, a second work function metal diffusion blocking layer 10B, and a gate filling layer 10C; wherein the second MOSFET comprises second source and drain regions 3B in the substrate 1, second source and drain extension regions 4B at the inner side of the first source and drain regions 4B, second gate spacers 5B on the second source and drain extension regions 4B, second source and drain contact metal silicides 6B on the second source and drain regions 3B, a second gate stack structure between the second gate spacers 5B on the substrate 1, a contact etch stop layer 7, interlayer dielectric layers 8/8B, and second source and drain metal plugs 11B passing though the interlayer dielectric layers to be in contact with the source and drain contact metal silicides 6B, the contact etch stop layer 7 being located on the second source and drain contact metal silicides 6B, second gate spacers 5B, and the second gate stack structure, wherein the second gate stack structure sequentially comprises a second gate insulating layer 9B, a first work function metal layer 10A, a second work function metal layer 10D, and a gate filling layer 10C. Particularly, the first work function metal layer 10A has a first stress, whereas the gate filling layer 10C has a second stress, the first stress is of an opposite type of the second stress, e.g., tensile stress/compressive stress, or compressive stress/tensile stress, and the absolute value thereof is greater than 1 GPa, and preferably between 2 GPa~10 GPa. Wherein the specific materials and methods for forming the above layers have been described in detail in the above manufacturing method, no more unnecessary details will be provided here.

In addition, although the present invention only contain schematic diagrams of an MOSFET having planar channel in the drawings, it will be appreciated by a person skilled in the art that the MOSFET structure of the present invention may also be applied to device structures such as 3D multigates, vertical channel, and nanowire.

In accordance with the semiconductor device and the method of manufacturing the same in the present invention, two metal gate layers of different types and/or intensity of stress are formed, respectively, thus different stresses are applied to the channel regions of different MOSFETs effectively and accurately, the device carrier mobility is enhanced simply and efficiently, and the device performance is also enhanced.

Although the present invention has been described with reference to one or more illustrative embodiments, it may be appreciated by a person skilled in the art that various appropriate modifications and equivalents can be made to the device structure without departing from the scope of the present invention. Besides, many modifications adaptable to specific situations or materials can be made under the disclosed teaching without departing from the scope of the present invention. Therefore, the present invention does not aim to define the specific embodiments which are disclosed as the preferred embodiments for implementing the present invention, the disclosed device structure and the manufacturing method thereof will include all the embodiments that fall within the scope of the present invention.

What is claimed is:

1. A semiconductor device, comprising a substrate, a plurality of gate stack structures on the substrate, a plurality of gate spacer structures on both sides of each of the plurality of the gate stack structures, a plurality of source and drain regions in the substrate on both sides of each of the plurality of the gate spacer structures, the plurality of gate stack structures comprising a plurality of first gate stack structures and a plurality of second gate stack structures, wherein each of the plurality of the first gate stack structures consists of a first gate insulating layer, a first work function metal layer formed directly on the first gate insulating layer, a second work function metal diffusion blocking layer formed on the first work function metal layer, and a gate filling layer formed on and in direct contact with the second work function metal diffusion blocking layer, each of the plurality of the second gate stack structures comprises a second gate insulating layer, the first work function metal layer formed directly on the second gate insulating layer, a second work function metal layer formed on the first work function metal layer, and the gate filling layer formed on and in direct contact with both the first work function metal layer and the second work function metal layer of each of the plurality of the second gate stack structures, and the second work function metal diffusion blocking layer has a first stress, the gate filling layer has a second stress, and the first stress is opposite to the second stress.

2. The semiconductor device according to claim 1, wherein the first and/or the second gate insulating layer comprises at least one of silicon oxide, nitrogen-doped silicon oxide, silicon nitride, and high-K materials.

3. The semiconductor device according to claim 2, wherein the high-K materials include Hf-based materials selected from $HfO_2$, $HfSiO_x$, HfSiON, $HfAlO_x$, $HfAlO_x$, $HfLaO_x$, $HfLaO_x$, and $HfLaSiO_x$, rare-earth based high-K dielectric materials selected from $ZrO_2$, $La_2O_3$, $LaAlO_3$, $TiO_2$, and $Y_2O_3$, $Al_2O_3$, or a composite layer of the above materials.

4. The semiconductor device according to claim 1, wherein the first work function metal layer comprises: a) metal nitride, including at least one of $M_xN_y$, $M_xSi_yN_z$, $M_xAl_yN_z$, and $MaAl_xSi_yN_z$, wherein M is at least one of Ta, Ti, Hf, Zr, Mo, and W; and/or b) metal or metal alloy, including at least one of Co, Ni, Cu, Al, Pd, Pt, Ru, Re, Mo, Ta, Ti, Hf, Zr, W, Ir, Eu, Nd, Er, and La.

5. The semiconductor device according to claim 1, wherein the second work function metal diffusion blocking layer comprises at least one of $M_xN_y$, $M_xSi_yN_z$, $M_xAl_yN_z$, and $MaAl_xSi_yN_z$, wherein M is at least one of Ta, Ti, Hf, Zr, Mo, and W.

6. The semiconductor device according to claim 1, wherein the gate filling layer comprises: a) metal nitride, including at least one of $M_xN_y$, $M_xSi_yN_z$, $M_xAl_yN_z$, and $MaAl_xSi_yN_z$, wherein M is at least one of Ta, Ti, Hf, Zr, Mo, and W; and/or b) metal or metal alloy, including at least one of Co, Ni, Cu, Al, Pd, Pt, Ru, Re, Mo, Ta, Ti, Hf, Zr, W, Ir, Eu, Nd, Er, and La; and/or c) metal silicide, including at least one of $CoSi_2$, $TiSi_2$, NiSi, PtSi, NiPtSi, CoGeSi, TiGeSi, and NiGeSi; and/or d) metal oxide conductor, including at least one of $In_2O_3$, $SnO_2$, ITO, and IZO; and/or e) semiconductor materials, including at least one of doped polysilicon, amorphous silicon, polycrystalline germanium, and polycrystalline silicon-germanium; or a composite layer of the above materials.

7. The semiconductor device according to claim 1, wherein the first stress is a tensile stress and the second stress is a compressive stress, or the first stress is a compressive stress and the second stress is a tensile stress.

8. The semiconductor device according to claim 1, wherein an absolute value of the first stress and/or the second stress is greater than 1 GPa.

9. A method for manufacturing a semiconductor device, comprising steps of:
forming a plurality of source and drain regions in a substrate;
forming a plurality of gate spacer structures on the substrate, wherein the plurality of the gate spacer structures enclose a plurality of first gate trenches and a plurality of second gate trenches, and there is an interlayer dielectric layer around the plurality of the gate spacer structures;
depositing a first gate insulating layer and a second gate insulating layer in each of the plurality of the first and second gate trenches;
depositing a first work function metal layer directly on the first gate insulating layer and the second gate insulating layer in each of the plurality of the first and second gate trenches; and
depositing a second work function metal diffusion blocking layer having a first stress on the first work function metal layer in each of the plurality of the first and second gate trenches;

performing selective etching to remove the second work function metal diffusion blocking layer from each of the plurality of the second gate trenches to expose the first work function metal layer; and
depositing a gate filling layer having a second stress on the second work function metal diffusion blocking layer in each of the plurality of the first gate trenches and on the first work function metal layer in each of the plurality of the second gate trenches, wherein the first stress is opposite to the second stress, and the gate filling layer is in direct contact with the second work function metal diffusion blocking layer;
forming a second work function metal layer in each of the plurality of the second gate trenches while the second work function metal diffusion blocking layer prevents the formation of the second work function metal layer in each of the plurality of the first gate trenches, and wherein the gate filling layer is in direct contact with both the first work function metal layer and the second work function metal layer.

10. The method for manufacturing the semiconductor device according to claim 9, wherein the first and/or the second gate insulating layer comprises at least one of silicon oxide, nitrogen-doped silicon oxide, silicon nitride, and high-K materials.

11. The method for manufacturing the semiconductor device according to claim 10, wherein the high-K materials include Hf-based materials selected from $HfO_2$, $HfSiO_x$, HfSiON, $HfAlO_x$, $HfTaO_x$, $HfLaO_x$, $HfAlSiO_x$, and $HfLaSiO_x$, rare-earth based high-K dielectric materials including $Al_2O_3$, or a composite layer of the above materials.

12. The method for manufacturing the semiconductor device according to claim 9, wherein the first work function metal layer comprises: a) metal nitride, including at least one of $M_xN_y$, $M_xSi_yN_z$, $M_xAl_yN_z$, and $MaAl_xSi_yN_z$, wherein M is at least one of Ta, Ti, Hf, Zr, Mo, and W; and/or b) metal or metal alloy, including at least one of Co, Ni, Cu, Al, Pd, Pt, Ru, Re, Mo, Ta, Ti, Hf, Zr, W, Ir, Eu, Nd, Er, and La.

13. The method for manufacturing the semiconductor device according to claim 9, wherein the second work function metal diffusion blocking layer comprises at least one of $M_xN_y$, $M_xSi_yN_z$, $M_xAl_yN_z$, and $MaAl_xSi_yN_z$, wherein M is at least one of Ta, Ti, Hf, Zr, Mo, and W.

14. The method for manufacturing the semiconductor device according to claim 9, wherein the gate filling layer comprises: a) metal nitride, including at least one of $M_xN_y$, $M_xSi_yN_z$, $M_xAl_yN_z$, and $MaAl_xSi_yN_z$, wherein M is at least one of Ta, Ti, Hf, Zr, Mo, and W; and/or b) metal or metal alloy, including at least one of Co, Ni, Cu, Al, Pd, Pt, Ru, Re, Mo, Ta, Ti, Hf, Zr, W, Ir, Eu, Nd, Er, and La; and/or c) metal silicide, including at least one of $CoSi_2$, $TiSi_2$, NiSi, PtSi, NiPtSi, CoGeSi, TiGeSi, and NiGeSi; and/or d) metal oxide conductor, including at least one of $In_2O_3$, $SnO_2$, ITO, and IZO; and/or e) semiconductor materials, including at least one of doped polysilicon, amorphous silicon, polycrystalline germanium, and polycrystalline silicon-germanium; or a multi-layer composite layer of the above materials.

15. The method for manufacturing the semiconductor device according to claim 9, wherein the first stress is a tensile stress and the second stress is a compressive stress, or the first stress is a compressive stress and the second stress is a tensile stress.

16. The method for manufacturing the semiconductor device according to claim 9, wherein an absolute value of the first stress and/or the second stress is greater than 1 GPa.

17. The method for manufacturing the semiconductor device according to claim 9, wherein method for depositing the second work function metal diffusion blocking layer and method for depositing the gate filling layer and process parameters are adjusted to achieve a different first stress and a different second stress.

18. The method for manufacturing the semiconductor device according to claim 9, wherein after formation of the gate filling layer, a surface high-temperature fast annealing is used to improve or change the stress.

19. The method for manufacturing the semiconductor device according to claim 9, wherein after the depositing of the gate filling layer, an annealing or a subsequent deposition process is performed to form a second work function metal layer, wherein a temperature is not higher than 550° C., and an annealing time is not longer than 30 minutes.

* * * * *